(12) United States Patent
Irino

(10) Patent No.: US 6,380,752 B1
(45) Date of Patent: Apr. 30, 2002

(54) IC SOCKET

(75) Inventor: Hitoshi Irino, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/437,681

(22) Filed: Nov. 10, 1999

(30) Foreign Application Priority Data

Nov. 11, 1998 (JP) .......................................... 10-320266

(51) Int. Cl.$^7$ .............................................. G01R 31/02
(52) U.S. Cl. ...................................... 324/755; 324/754
(58) Field of Search ................................. 324/127, 500, 324/537, 158.1, 754, 755, 117 R, 117 H

(56) References Cited

U.S. PATENT DOCUMENTS

| | | | | |
|---|---|---|---|---|
| 5,729,898 A | * | 3/1998 | Ogawa | ......................... 29/883 |
| 5,789,929 A | * | 8/1998 | Hankui | ........................ 324/642 |
| 6,087,842 A | * | 7/2000 | Parker et al. | ................ 324/763 |

FOREIGN PATENT DOCUMENTS

| | | | | |
|---|---|---|---|---|
| JP | 62-177456 | 8/1987 | ........... | G01R/1/073 |
| JP | 4-53562 | 5/1992 | ........... | G01R/1/067 |
| JP | 8-271579 | 10/1996 | ........... | G01R/31/26 |

OTHER PUBLICATIONS

English Translation of "Magnetic Field Probe With Multi-layer Construction For High Spatial Resolution" by Naoya Tamaki, et al.*
Yamaguchi et al, "A Magnetic Probe with Multilayer Structure for High Spatial Resolution" Technical Report of the Institute of Electronics, Information and Communication Engineers, Jul. 1997 pp. 15–20.
Sasaki et al, "Measurement of Magnetic Field near a PCB and it Application to EMC Problems".
Technical Report of the Institute of Electronics, Information and Communication Engineers, Dec. 1997, pp. 9–13.

* cited by examiner

Primary Examiner—Safet Metjahic
Assistant Examiner—Paresh Patel
(74) Attorney, Agent, or Firm—Hayes Soloway P.C.

(57) ABSTRACT

A minute shielded loop probe is built in the vicinity of the terminal of the IC socket. The IC is fixed to the IC socket and driven by the external power source and the external signal, and thereby a magnetic field generates in the vicinity of the terminal of the IC by the high frequency current flowing through this terminal. It is possible to obtain the high frequency current flowing through the terminal on the magnetic field. With this procedure, it is possible obtain the high frequency current accurately and easily, and then to take effective measures against EMI.

18 Claims, 4 Drawing Sheets

IC SOCKET

BACKGROUND OF THE INVENTION

1. Field of the Invention

The present invention relates to an IC socket and more particularly to an IC socket in which a shielded loop probe is built in the vicinity of a terminal or is capable of being inserted.

2. Description of the Related Art

It is known that most of the radiated emission generated from electronic apparatuses is caused by high frequency currents flowing from/into an IC (Integrated Circuit). Therefore, to control EMI (Electro Magnetic Interference), it is indispensable to take effective measures for designing after measuring a high frequency current flowing through the IC.

However, a current flowing through an existing high speed IC has a high frequency. Thus, under the existing conditions, it is very difficult for a conventional current probe, a conventional oscilloscope or the like to directly measure the current.

A technique is proposed in which a magnetic probe measures a magnetic field generated from an IC and then a time domain of the current is obtained on the basis of the measured magnetic field. (See, Pages 10 and 11, "Measurement of Magnetic Field near a PCB and its Application to EMC Problems" by SASAKI and HARADA, Technical Report of the Institute of Electronics, Information and Communication Engineers, December 1997).

Next, a description is given of a conventional technique with reference to FIG. 7.

A magnetic probe (shielded loop probe) 46 is produced by a multilayer printed circuit board production process or a semiconductor production process and is provided with three conductor faces (layers) and dielectric faces (layers) therebetween. In FIG. 7, conductor layers 41, 42, 43 are respectively insulated by dielectric layers, and thereby the magnetic probe is formed into like a coaxial cable. The conductor layers 41, 43 correspond to GNDs and the conductor layer 42 corresponds to a core wire of the coaxial cable.

As above described, the magnetic probe 46 is produced by a multi layer structure of a printed circuit board. The probe 46 is fixed in the vicinity of a wiring on an printed circuit board or a pin of an IC to be measured with a fixing jig, and then measures a magnetic field.

The loop is formed by the printed circuit board process or the like, therefore, it is possible to make a probe smaller and closer to an object to be measured than a loop probe using a semirigid cable. As a result, it is possible to obtain high resolution. (See, Page 18, FIG. 5 "A Magnetic Probe with Multlayer Structure for High Spatial Resolution" by TAMAKI, MASUDA, and YAMAGUCHI, Technical Report of the Institute of Electronics, Information and Communication Engineers, July 1997).

Further, Japanese Laid-Open Utility Model Application No. Hei4-53562 discloses a probe measuring a magnetic field. The probe uses a coil and is built-in an IC socket.

Japanese Laid-Open Patent Application No. Hei8-271579 shows an IC socket capable of detecting an electric potential of a lead in an IC accurately. In this IC socket, the lead of the IC is electrically conductive with a probe via a contact. The probe is formed into a pole, since it is inserted into a hole of the IC socket so as to touch the contact.

Japanese Laid-Open Patent Application No. Sho62-177456 shows a probe in which a characteristic impedance is constant at any position of the probe. The probe is used in contact with a pad of an IC, an LSI or the like, and is formed into a pole so as to meet this usage.

However, there are problems in the above-described conventional techniques.

In a first problem, to reduce magnetic field effect generating from pins other than those to be measured for accurate measurement, it is necessary to make an interval between a pin to be measured and a shielded loop probe or an interval between a pin to be measured and a coil shorter than a pin interval of the IC. However, it is difficult to arrange the shielded loop probe and/or a coil in the vicinity of the pin to be measured.

As its causes, a cable and an IC socket are positioned in the vicinity of an IC to be measured, therefore, it is difficult to keep a position for the shielded loop probe. Further, when a coil is built in an IC socket, it is difficult to produce a coil smaller than a pin interval of an existing IC.

In a second problem, a pin interval of an IC is provided in units of mm, therefore, it is necessary to position a shielded loop probe with 0.1 mm accuracy for accurate measurement. However, it is difficult and troublesome to position the shielded loop probe in the vicinity of the pin to be measured.

As its causes, the shielded loop probe is separate from a measuring system, therefore, it is necessary to replace a magnetic probe by hand. As a result, the operation becomes troublesome, and the shielded loop probe is not in its position subtly.

In a third problem, concerning the IC socket shown in Japanese Laid-Open Patent Application No. Hei8-271579, the probe and the terminal are electrically conductive, therefore, it is impossible to measure the magnetic field caused by the high frequency current flowing through the IC terminal.

SUMMARY OF THE INVENTION

In view of the above, it is an object of the present invention to provide an IC socket capable of measuring a magnetic field generating from a pin of an IC accurately and easily.

According to a first aspect of the present invention, there is provided an IC socket having:
  a terminal electrically connected with an IC, and a shielded loop probe built in vicinity of the terminal.

Also, according to a second aspect of the present invention, there is provided an IC socket having:
  a terminal electrically connected with an IC, and a shielded loop probe capable of being inserted in vicinity of the terminal.

In the foregoing second aspect, a preferable mode is one that wherein further includes a slit through which the shielded loop probe is inserted.

Also, according to a third aspect of the present invention, there is provided an IC socket having:
  a terminal electrically connected with an IC, insulation covering the terminal, and a shielded loop probe put on a surface Also, a preferable mode is one wherein a width of the shielded loop probe is approximately 0.3 through 1.0 mm. therefore, it becomes unnecessary to prepare the shielded loop probe by hand. As a result, measurement can be carried out easily and accurately.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes for carrying out the present invention will be described in further detail using various embodiments with reference to the accompanying drawings.

First Embodiment

Figure 1:
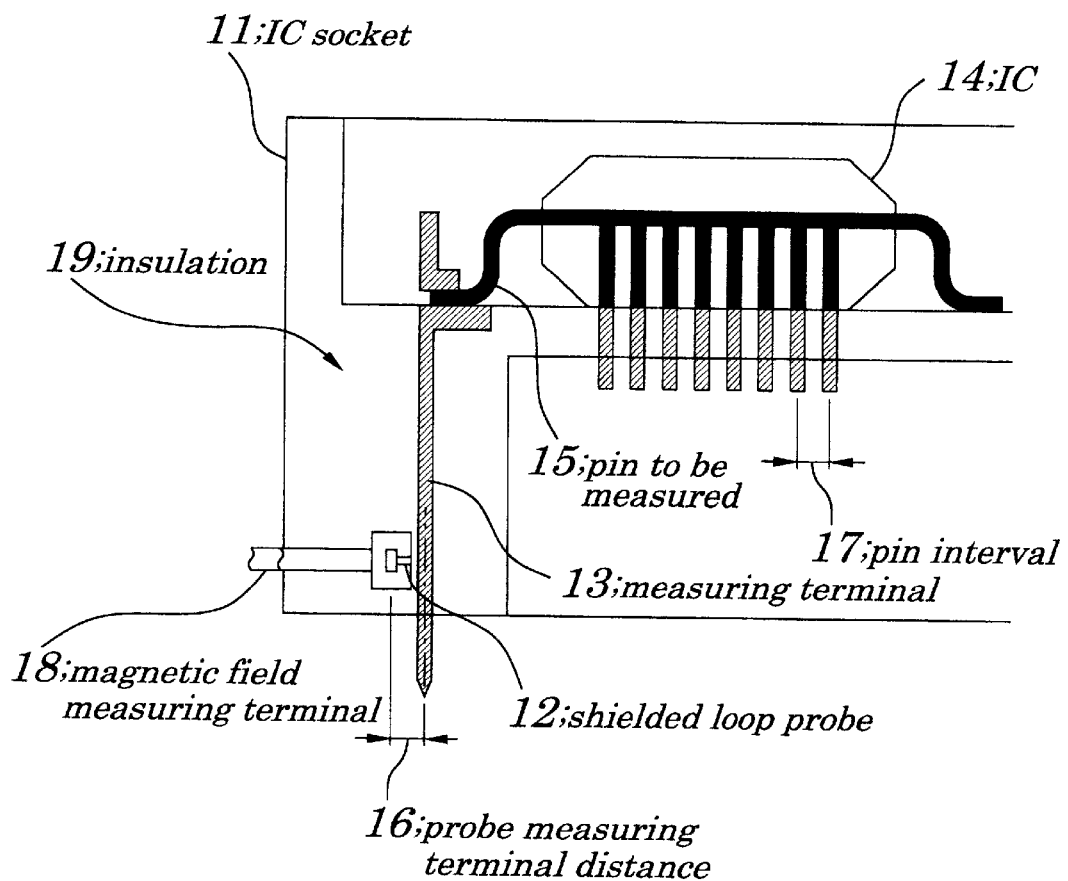
FIG. 1 is a sectional view showing a first embodiment of the present invention.
Figure 2:
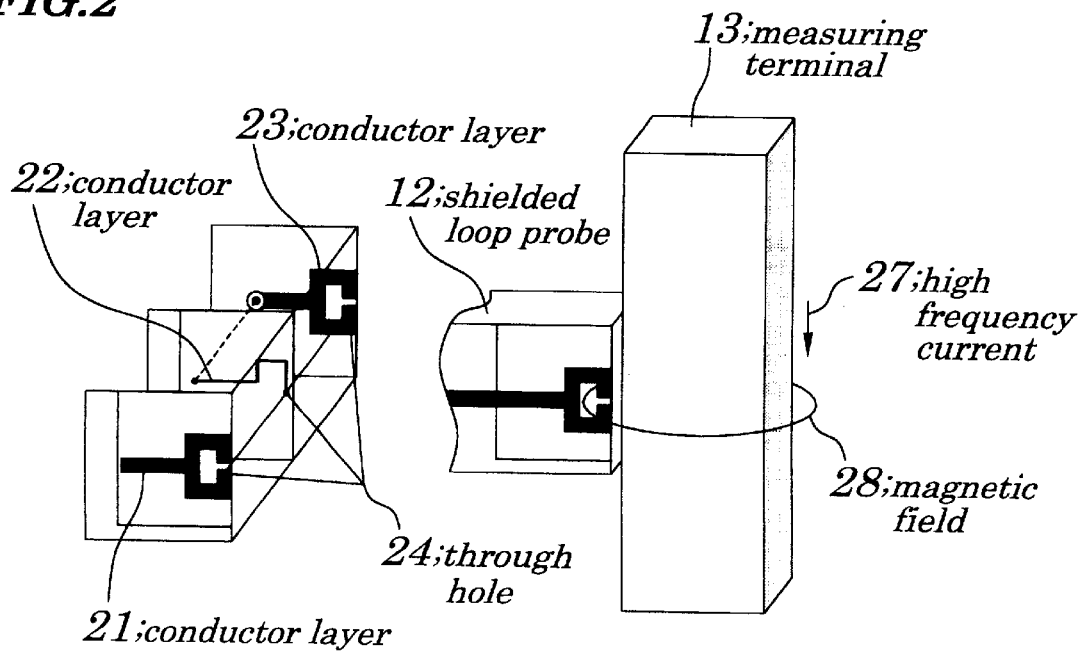
FIG. 2 is an enlarged view showing a shielded loop probe.

FIG. 1 is a sectional view showing a first embodiment of the present invention. FIG. 2 is an enlarged view showing a shielded loop probe. The first embodiment shows an IC socket for a QFP (Quad Flat Package) as an example.

An IC socket 11 according to the first embodiment is formed from insulation 19, and an IC 14 to be measured is fixed to the IC socket 11. A pin 15 to be measured, extending from the IC 14, is fixed by a measuring terminal 13. The IC 14 is driven by an external power supply (electric power) and an external signal. Thereby, a high frequency current 27 of the IC 14 flows through the measuring terminal 13. Incidentally, the electric power and an external signal are supplied through the measuring terminal 13 or another terminal.

Further, to reduce effects of magnetic fields generated from pins other than those to be measured, it is desirable that a distance 16 between the built-in shielded loop probe 12 and the measuring terminal 13 is shorter than a pin interval 17 and that the width of the shielded loop probe 12 is smaller than the pin interval 17.

For example, a QFP IC is provided with pin intervals of 0.3 mm through 1.0 mm, therefore, it is desirable that the distance 16 between the shielded loop probe 12 and the measuring terminal 13 and the width of the shielded loop probe 12 are 0.3 mm through 1.0 mm.

Figure 7:
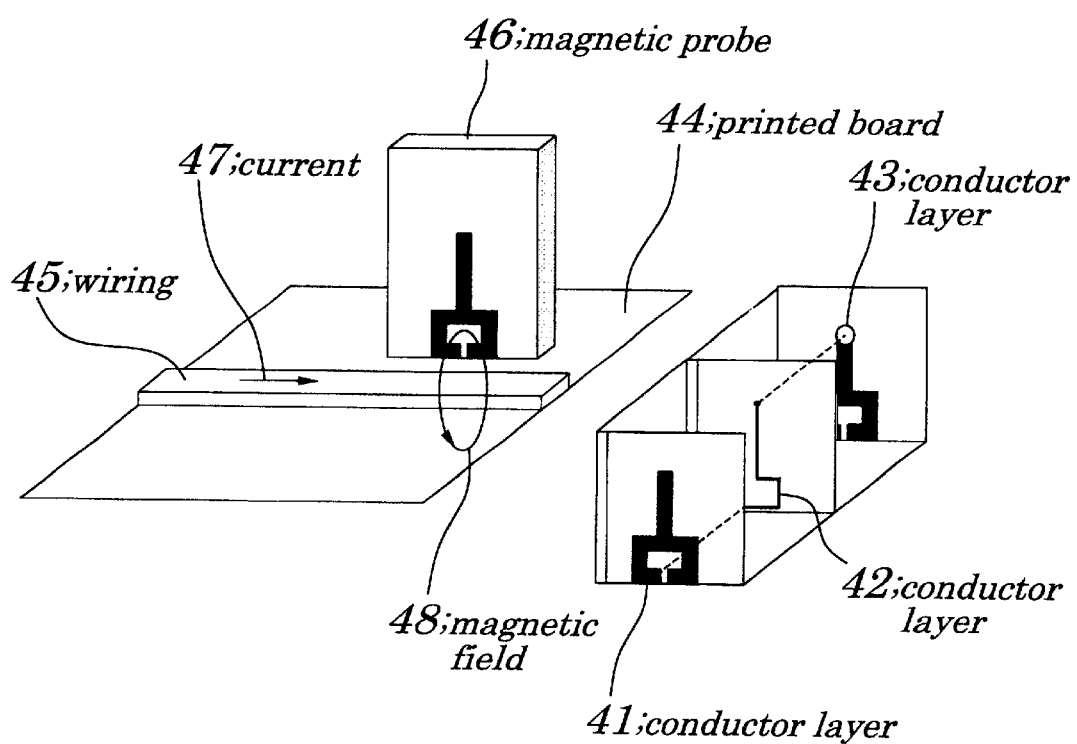
FIG. 7 is a view showing a conventional technique.

The shielded loop probe 12 is structured similarly to a conventional probe (such as the magnetic probe 46 shown in FIG. 7). That is, the shielded loop probe 12 is provided with three conductor layers and dielectric layers therebetween. The conductor layers 21, 22, 23 are respectively insulated by the dielectric layers, and thereby is formed into like a coaxial cable. The conductor layers 21, 23 correspond to GNDs and the conductor layer 22 corresponds to a core wire of the coaxial cable.

As shown in FIG. 2, each of the conductor layers is made by forming a microstrip line into a loop such as a U-shape and a O-shape so as to be suitable for detecting a magnetic field. With this structure, if is possible for the shielded loop probe 12 to negate electric fields and to detect only magnetic fields.

Further, it is possible to produce the shielded loop probe 12 by the multilayer printed circuit board production process or the semiconductor production process. In this case, it is possible to produce a wire width and a wiring interval in units of μm through mm, therefore, it is possible to make a width of the shielded loop probe 12 small, for example, in units of μm through mm.

It is also possible to produce the shielded loop probe 12 by the mold formation technique. In this case, the shielded loop probe 12 is produced by forming a wiring portion in accordance with a procedure for producing a lead frame used in a semiconductor package and then by putting a dielectric layer on the wiring portion. It is also possible to make a width of the shielded loop probe 12 small, for example, in units of μm through mm by the mold formation technique similar to the semiconductor production technique or the like.

The shielded loop probe 12 is built in the vicinity of the measuring terminal 13, and measures a magnetic field 28 generated by the high frequency current 27. At this time, as shown in FIG. 2, it is desirable that the shielded loop probe 12 and the measuring terminal 13 are positioned so that much of the magnetic field 28 passes through the O-shaped face of the shielded loop probe 12.

Next, an explanation will be given of the operation according to the first embodiment.

When the IC 14 is driven by the external power source and the external signal, the high frequency current 27 flows through the measuring terminal 13. At this time, the shielded loop probe 12 detects the magnetic field 28 generated from the measuring terminal 13. The shielded loop probe 12 is connected to a measuring apparatus such as an oscilloscope via a connector, a cable and so on. An operator can measure the magnetic field with this measuring apparatus.

In the first embodiment, the explanation is given of the QFP, however, the present invention is available to any type of a package such as DIP (Dual Inline Package), PGA (Pin Grid Array) and BGA (Ball Grid Array).

Figure 3:
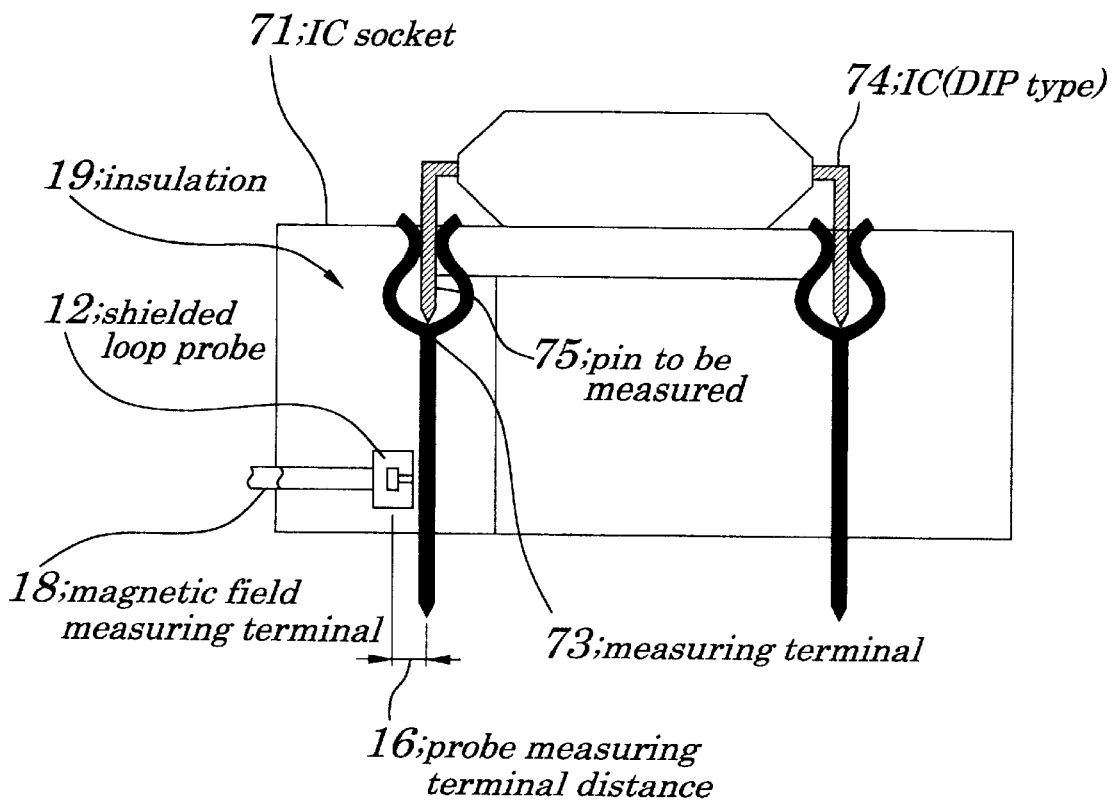
FIG. 3 is a sectional view showing a DIP according to the first embodiment of the present invention.

FIG. 3 show a DIP according to the present invention as an example. The DIP is different from the QFP in shapes of pins, therefore, a shape of a measuring terminal 73 may be changed so as to meet the pin of the DIP IC.

Second Embodiment

Figure 4:
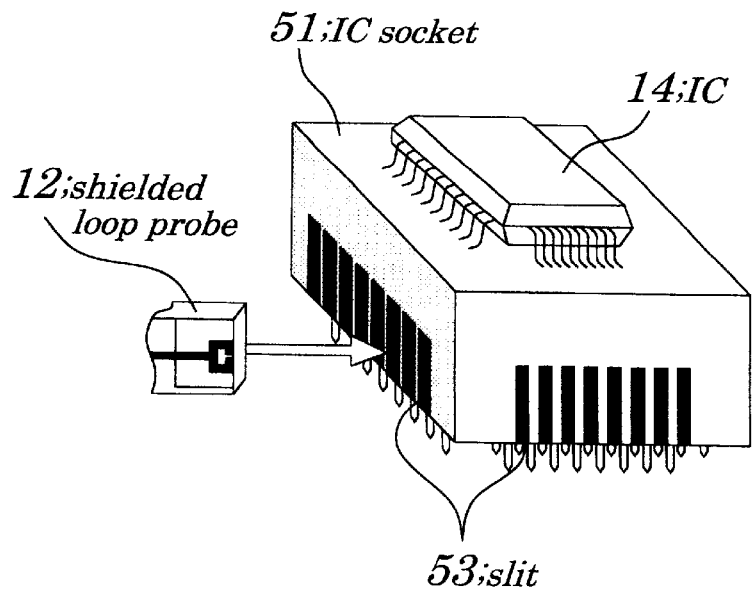
FIG. 4 is a perspective view showing a second embodiment of the invention.

Further, a second embodiment according to the present invention will be described. FIG. 4 is a perspective view showing the second embodiment of the invention.

In the first embodiment, the shielded loop probe 12 is built in the IC socket 11, however, there is a case in which the number of the shielded loop probes 12 is restricted in terms of the size of the IC socket 11 and the shielded loop probe 12. That is, when the shielded loop probe 12 is large compared with a short interval of a pin of an IC to be measured, there is a case in which it is impossible to build the shielded loop probe 12 coping with all pins therein.

Accordingly, in the second embodiment, the shielded loop probe 12 is not previously built in the IC socket. An IC socket is provided with slits, and the shielded loop probe 12 is inserted through the slit. With this structure, it is possible to measure magnetic fields for all pins.

Plural slits are formed on the side of the IC socket 51. The shielded loop probe 12 is inserted into the slit 53 so as to measure a magnetic filed of each pin. The slit 53 is preferably formed in a manner that the shielded loop probe 12 is fixed at the position suitable for measuring as shown in FIGS. 1 and 2 when the tip of the shielded loop probe 12 is inserted into the IC socket 51 through the slit 53.

Further, similarly to the first embodiment, the second embodiment is available to any type of an IC package such as QFP, DIP, PGA and BGA.

Third Embodiment

Figure 5:
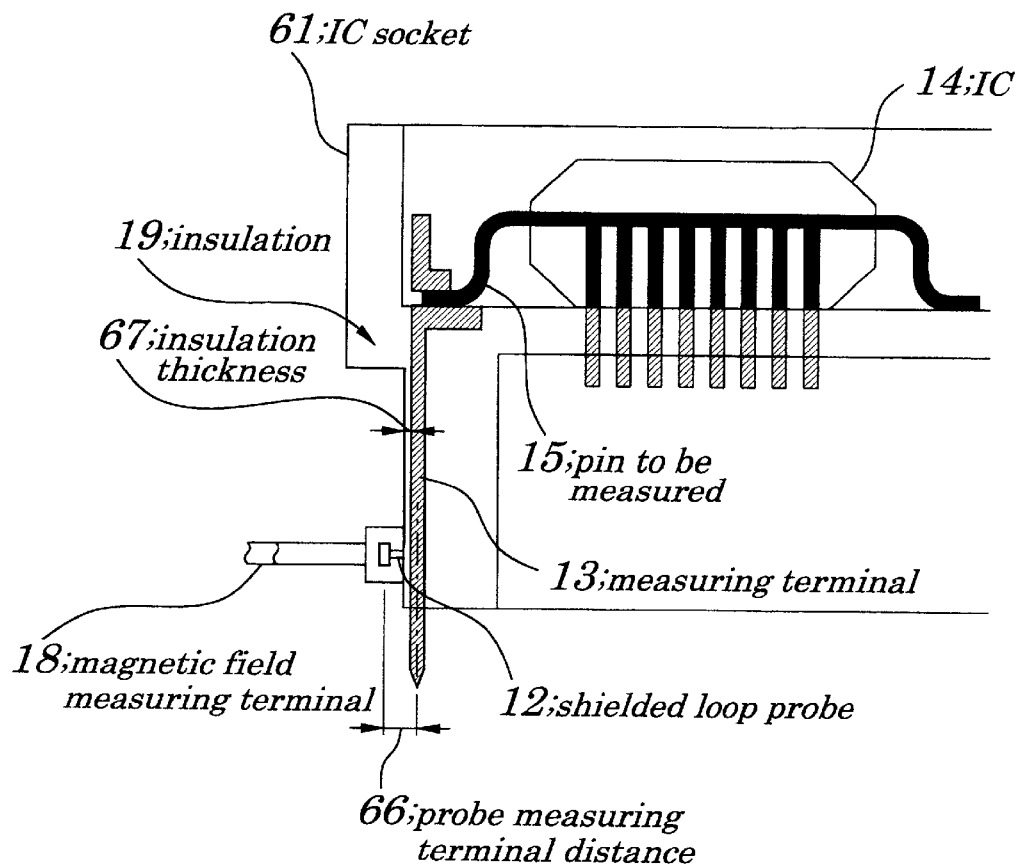
FIG. 5 is a perspective view showing a third embodiment of the invention.
Figure 6:
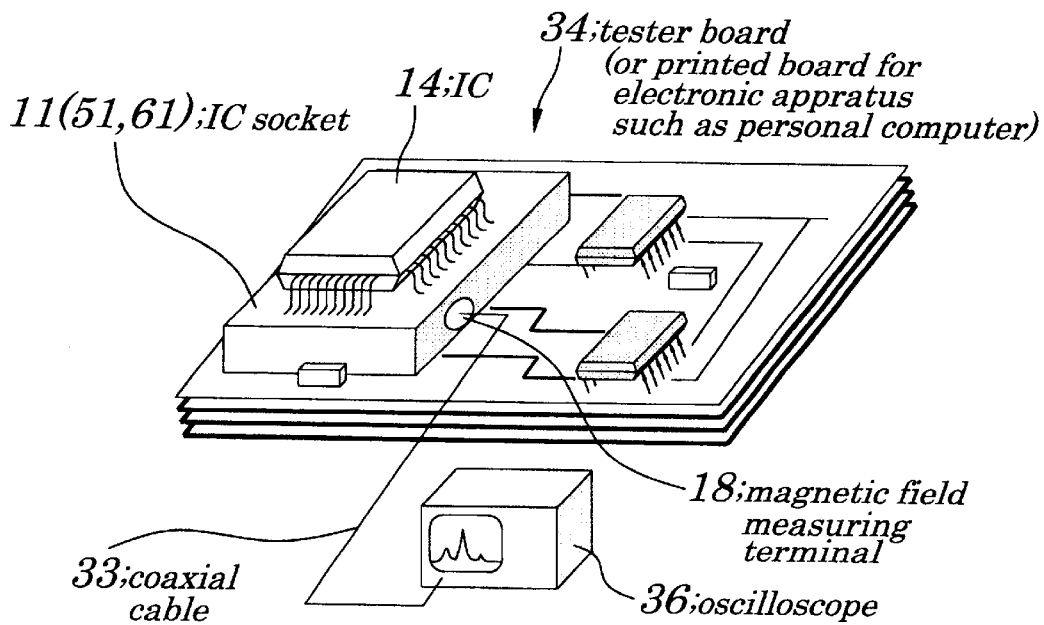
FIG. 6 is a view showing an application example of the present invention.

Further, a third embodiment according to the present invention will be described. FIG. 5 is a sectional view showing the third embodiment of the invention.

In the third embodiment, the shielded loop probe 12 is neither built in nor inserted into the IC socket. The shielded loop probe 12 is put on the surface of the IC socket to measure a magnetic field, unlike in the case of the first and second embodiments. The shielded loop probe 12 is put on the surface of the IC socket 61. When the IC socket 61 is structured in this way, the insulation such as resin covering the surface of the IC socket 61 is made thin (i.e. insulation thickness 67). With this structure, the distance between the shielded loop probe 12 and the measuring terminal 13 is shortened, therefore, it becomes possible to measure the magnetic field. Further, it is desirable that the shielded loop probe 12 and the measuring terminal 13 are positioned so as to be suitable for measuring similarly to the first embodiment as shown in FIG. 2. therefore, a magnetic field generates in the vicinity of the measuring terminal 13. The magnetic field 28 is detected by the shielded loop probe, and then is measured by the measuring apparatus 36 such as an oscilloscope as a voltage value. With this procedure, it is possible to obtain a magnetic field.

At this time, the shielded loop probe 12 built in or inserted into the IC 11, 51 or 61 is not in contact with the IC 14 concerning circuits, therefore, there is little effect on the circuit operation of the IC 14.

In the above described case, an example is given in which the IC socket according to the present invention is operated with the same fitted to the LSI tester. However, it is ideal to evaluate an IC under a condition in which the IC is implemented in a practical product. This is because, a circuit impedance loading on a terminal of the IC differs between a case in which the IC socket is mounted on the LSI tester and a case in which the IC socket is implemented in the product, and the evaluation by the LSI tester is not always accurate. Accordingly, it is possible to implement the IC socket of the present invention in an electronic apparatus such as a personal computer, a work station and a switching system to carry out an evaluation.

The first effect of the present invention is that a magnetic field in the vicinity of an IC pin can be measured more accurately than the conventional technique.

As its causes, a shielded loop probe is built in, inserted into or put on an IC socket, therefore, it is possible to position the shielded loop probe in the vicinity of a terminal to be measured. As a result, there is no restriction by an external cable or the like.

The second effect is that a magnetic field near an IC can be measured easily.

As its causes, a shielded loop probe is previously built in a measuring system, therefore, it is possible to save troubles to position the shielded loop probe whenever measuring.

It is thus apparent that the present invention is not limited to the above embodiments but may be changed and modified without departing from the scope and spirit of the invention.

Finally, the present application claims the priority based on Japanese Patent Application No. Hei10-320266 filed on Nov. 11, 1998, which is herein incorporated by reference.

What is claimed is:

1. An IC socket for measuring an IC that has a plurality of pins spaced from one another by a fixed interval, said IC socket comprising:
    a terminal electrically connected with an IC; and
    a built-in shielded loop probe located adjacent said terminal; wherein said shielded loop probe is spaced from said terminal by a distance that is shorter than said pin interval, and said shielded loop probe has a width that is less than said pin interval.

2. An IC socket for measuring an IC that has a plurality of pins spaced from one another by a fixed interval, said IC socket comprising:
    a terminal electrically connected with an IC;
    a built-in shielded loop probe located adjacent said terminal; and
    a slit through which said shielded loop probe is located, wherein said shielded loop probe is spaced from said terminal by a distance that is shorter than said pin interval, and said shielded loop probe has a width that is less than said pin interval.

3. An IC socket for measuring an IC that has a plurality of pins spaced from one another by a fixed interval, said IC socket comprising:
    a terminal electrically connected with an IC;
    insulation covering said terminal; and
    a built-in shielded loop probe located in contact with a surface of said insulation, wherein said insulation has a thickness that is less than the distance of said pin interval, and said shielded loop probe has a width that is less than said pin interval.

4. The IC socket according to claim 1, wherein said shielded loop probe includes three conductor layers and two dielectric layers.

5. The IC socket according to claim 1, wherein said shielded loop probe is formed into a loop from a microstrip line.

6. The IC socket according to claim 1, wherein said shielded loop probe is produced by a mold formation process, a printed circuit board production process or a semiconductor production process.

7. The IC socket according to claim 1, wherein a width of said shielded loop probe is approximately 0.3 mm through 1.0 mm.

8. The IC socket according to claim 1, for a DIP type, a PGA type, a GFP type or a BGA type of package.

9. The IC socket according to claim 1, attachable or attached to any one of an LSI tester, a personal computer, a work station and a switching system.

10. The IC socket according to claim 1, where said shielded loop probe is not in contact with said terminal.

11. The IC socket according to claim 1, wherein electric power or a signal is supplied for said IC through said terminal.

12. The IC socket according to claim 1, wherein electric power or a signal supplied for said IC is outputted from said terminal.

13. The IC socket according to claim 2, wherein said shielded loop probe is spaced from contact with said terminal.

14. The IC socket according to claim 2, wherein electric power or a signal is supplied for said IC through said terminal.

15. The IC socket according to claim 2, wherein electric power or a signal supplied for said IC is outputted from said terminal.

16. The IC socket according to claim 3, wherein said shielded loop probe is spaced from contact with said terminal.

17. The IC socket according to claim 3, wherein electric power of a signal is supplied for said IC through said terminal.

18. The IC socket according to claim 3, wherein electric power or a signal supplied for said IC is outputted from said terminal.

* * * * *